United States Patent
Huffman et al.

(10) Patent No.: US 7,155,658 B2
(45) Date of Patent: Dec. 26, 2006

(54) CRC CALCULATION FOR DATA WITH DYNAMIC HEADER

(75) Inventors: Amber D. Huffman, Banks, OR (US); Knut S. Grimsrud, Forest Grove, OR (US)

(73) Assignee: Intel Corporation, Santa Clara, CA (US)

( * ) Notice: Subject to any disclaimer, the term of this patent is extended or adjusted under 35 U.S.C. 154(b) by 580 days.

(21) Appl. No.: 10/327,396

(22) Filed: Dec. 20, 2002

(65) Prior Publication Data

US 2004/0123221 A1    Jun. 24, 2004

(51) Int. Cl.
*H03M 13/00* (2006.01)
*G06F 11/00* (2006.01)

(52) U.S. Cl. .................. 714/776; 714/781; 714/714; 714/808; 714/807

(58) Field of Classification Search ............... 714/776, 714/781, 758
See application file for complete search history.

(56) References Cited

U.S. PATENT DOCUMENTS

| | | | | |
|---|---|---|---|---|
| 5,954,835 A * | 9/1999 | Higginson et al. | .......... | 714/759 |
| 6,021,133 A * | 2/2000 | Asghar | .......... | 370/429 |
| 6,324,667 B1 * | 11/2001 | Sugaya | .......... | 714/746 |
| 6,425,106 B1 * | 7/2002 | Higginson et al. | .......... | 714/759 |
| 6,643,816 B1 * | 11/2003 | Uesugi et al. | .......... | 714/758 |

* cited by examiner

*Primary Examiner*—Phung My Chung
(74) *Attorney, Agent, or Firm*—Carrie A. Boone, P.C.

(57) ABSTRACT

A method for performing CRC calculations on packets with dynamic headers is disclosed. The header may be changed during transmission across a network. When the header is changed, a CRC associated with the header is recalculated such that a residue of the initial seed value is always obtained. A final CRC covers the entire packet including the header and its header CRC, or just the data portion of the packet. The final CRC remains valid and unchanged during transmission of the packet, allowing an endpoint along the network to confirm the validity of the entire packet. By only changing the CRC associated with the changed portion of the packet (the header CRC), the introduction of errors during transmission of the packet is minimized.

22 Claims, 8 Drawing Sheets router operation - verifying header router operation - updating header receiving device operation

CRC CALCULATION FOR DATA WITH DYNAMIC HEADER

FIELD OF THE INVENTION

This invention relates to packet transmission verified using cyclic redundancy check (CRC) codes and, more particularly, to packets including dynamic headers.

BACKGROUND OF THE INVENTION

Data transmissions generally include extra information, submitted along with the data at a transmitter, which is used at the receiver to verify an error-free transmission. The extra information may, for example, be a cyclic redundancy check (CRC) code, a type of error identification code. A CRC engine at the transmitter generates the CRC code, then another CRC engine at the receiver checks the CRC code.

After the CRC engine is initialized with a seed value, polynomial, or modulus-based, arithmetic is performed on each data block to be transmitted, generating a CRC code for the data. In CRC-32B, for example, the transmitter CRC engine uses a 32-bit generator polynomial, $X^{32}+X^{26}+X^{23}+X^{22}+X^{16}+X^{12}+X^{11}+X^{10}+X^8+X^7+X^5 +X^4+X^2+X^1+X^0$, to operate upon the data block. The resulting CRC is appended to the end of the data block and a new block comprising both the data block and the CRC are transmitted to a receiving device. The polynomial arithmetic may be, for example, modulo-2, although any modulus-based arithmetic in which the modulus is a prime number may characterize CRC calculations.

At the receiver, the same 32-bit polynomial is used to operate upon the new block by the receiver CRC engine. Where the expected result is obtained, the data was transmitted successfully. Where the result is not the expected result, the retransmission of the damaged data block can be arranged. Some variation to the described scheme is possible, as CRC algorithms are employed in a wide array of data communications systems.

CRC engines are typically made up of digital logic such as flip-flops, for automatically generating and appending the CRC to the data stream (at the transmitting end) and, likewise, computing the CRC of the combined data and CRC block at the receiving end. CRC-32 may be implemented with a linear feedback shift register (LFSR) comprising multiple D flip-flops, as one example. Or, the modulo-2 arithmetic performed in each CRC engine may be implemented in firmware or other software programs. A combination of hardware and software solutions is also possible.

Advanced Technology Attachment (ATA) is a technology in which drive controllers are integrated onto disk drives. Serial ATA is a physical storage interface defining protocols for the internal attachment of storage devices. Under Serial ATA, a CRC check is used to verify packet transmission to or from the ATA device. A specific generator polynomial (CRC-32B) and a seed value (0x52325032) are used to calculate the CRC. (Serial ATA is a product of the Serial ATA Working Group. Specifications under Serial ATA are available at www.serialata.org.)

There is a new class of serial ATA devices used to route data between host ports and receiving devices. Referred to herein as routers, these new devices allow multiple entities to be connected to a single host port along a transmission interface. A routing header is prepended to each packet prior to transmission. The routing header indicates the path to which the packet is to be transmitted and thus identifies which device in the transmission interface is the intended recipient of the packet. When the router receives the packet, it reads the routing header and forwards the packet accordingly.

In efficient router designs, the routers include a small amount of buffering for the incoming packets. In some cases, the router may start to forward a packet to the next port before receiving the entire packet. Since the routing header tells the router where the packet is to be sent, the router will at least buffer the header information before forwarding the packet to the intended port. To ensure that the header is valid, a dedicated header CRC, generated at the transmitter, is appended after the routing header.

Once the router identifies the intended recipient of the packet, the routing header is modified to construct a reverse path back to the transmitting device. This allows the receiving device to identify the transmitting device and intended recipient of a response packet. Where the transmission path includes multiple routers, the routing header is updated multiple times. Likewise, the header CRC is updated each time the routing header is changed.

In traditional CRC design, the CRC is the residue (remainder) of the data to be protected (viewed as a polynomial) divided by a generator polynomial. If the packet is valid, the receiving device CRC engine will sum the CRC value and the CRC residue prior to the CRC field. Using modulo-2 arithmetic, these two values sum to an expected result if the packet is valid.

If traditional CRC design is used for both the routing header CRC and the data CRC, the CRC residue will be the expected result after the header CRC field. However, under Serial ATA, the initial seed for the CRC starting at the data field must be 0x52325032. In order for both statements to be true, the transmitting device CRC engine would have to reset or "re-seed" after calculating the header CRC, but before calculating the final CRC. The same would be true for the receiving device CRC engine. Hardware CRC engines could be re-designed to reset after processing the header CRC, but at an increase in cost. Further, each entity in the transmission interface would be expected to employ these re-designed CRC engines.

Traditional CRC design presents another limitation. With a packet including both a header CRC and a final CRC, if the final CRC applies to the entire packet, the final CRC will be re-calculated (at the router) following a change to the header. However, routers need the header CRC alone. If the final CRC applies to just the data portion of the packet, endpoints (hosts and devices) will perform CRC validation on both the header portion and the data portion, to ensure the validity of the entire packet. However, endpoints need the data CRC alone. Thus, under the traditional CRC design, the division of labor between the router and the endpoints is not reflected in performing CRC calculations.

It would be more efficient if the endpoint could check a single CRC that covers the entire packet. If the final CRC is used to cover the entire packet, the endpoint could ignore the header CRC field in determining the validity of the packet. No reset of the CRC engine would be necessary.

However, where the final CRC covers the entire packet, another problem is presented. Since each router in the point-to-point interface changes the header, the final CRC would have to be recomputed as well at the router. Each time a CRC is recalculated, there is a chance that a prior transmission error is inadvertently corrected. Thus, it would be preferable not to recalculate the final CRC at each router.

Thus, there is a need to transmit packets in a transmission interface such that the final CRC for each packet is calculated only at the original transmission point and unchanged thereafter, where the packets include a header that may be modified by an entity along the transmission interface (i.e., a dynamic header), wherein the header is also covered by a separate CRC.

DETAILED DESCRIPTION

According to the embodiments described herein, a method for performing cyclic redundancy check, or CRC, calculations on dynamic packets is disclosed. CRCs are a type of error identification code used to confirm the integrity of a transmitted packet. A portion of the packet includes a header or other dynamic data that includes a dedicated header CRC ($CRC_H$). The header and the header CRC may be changed at locations along a point-to-point interface. When the header is changed at a location, the header CRC is recalculated.

The packet further includes a final CRC ($CRC_F$), to simultaneously cover the entire packet, including the header and header CRC, and the packet excluding the header information, i.e., just the data portion of the packet. The header CRC is computed such that, when updated to reflect a change in the header, the final CRC does not change. A prime-number modular arithmetic operation, such as modulo-2 addition, is performed during the calculation of the header CRC. This allows the final CRC to remain unchanged, despite the fact that the packet may change during transmission. The method provides a division of labor along the transmission interface, in which the host port generates both the header CRC and the final CRC, the routing devices verify and update the header and the header CRC without affecting the final CRC, and the receiving devices verify either the data only or the entire packet using the final CRC, otherwise ignoring the header information.

In the following detailed description, reference is made to the CRC-32B code, including operational details associated with Serial ATA. However, it is to be understood that the operations described herein may be applied to other CRC codes, including, but not limited to CRC-8, CRC-12, and CRC-16, as well as other error identification codes used for transmitting data. Likewise, the operations described herein may be applied to virtually any packet comprising dynamic, or changing, information.

Further, reference is made to the accompanying drawings, which show by way of illustration specific embodiments in which the invention may be practiced. However, it is to be understood that other embodiments will become apparent to those of ordinary skill in the art upon reading this disclosure. The following detailed description is, therefore, not to be construed in a limiting sense, as the scope of the present invention is defined by the claims.

Figure 1:
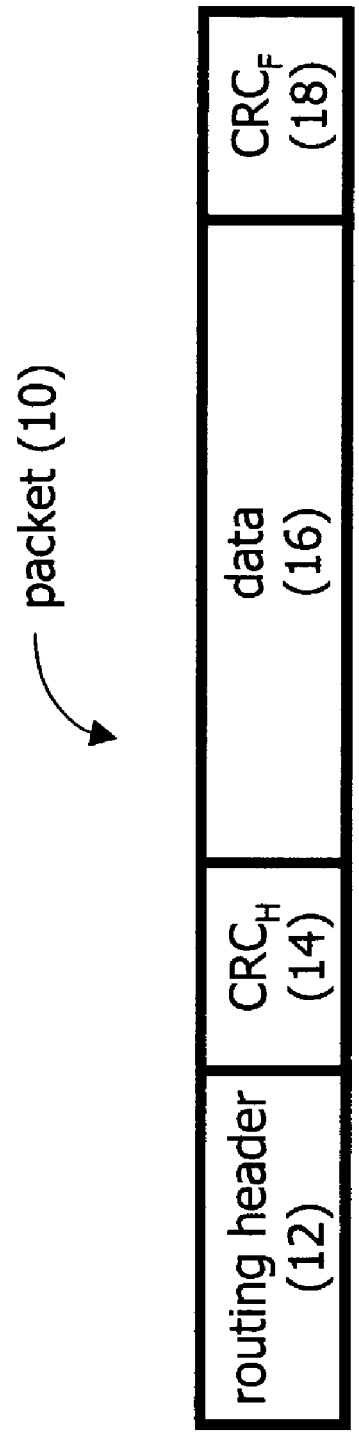
FIG. 1 is a block diagram of a packet including a both a header CRC and a final CRC according to one embodiment of the invention.
Figure 2:
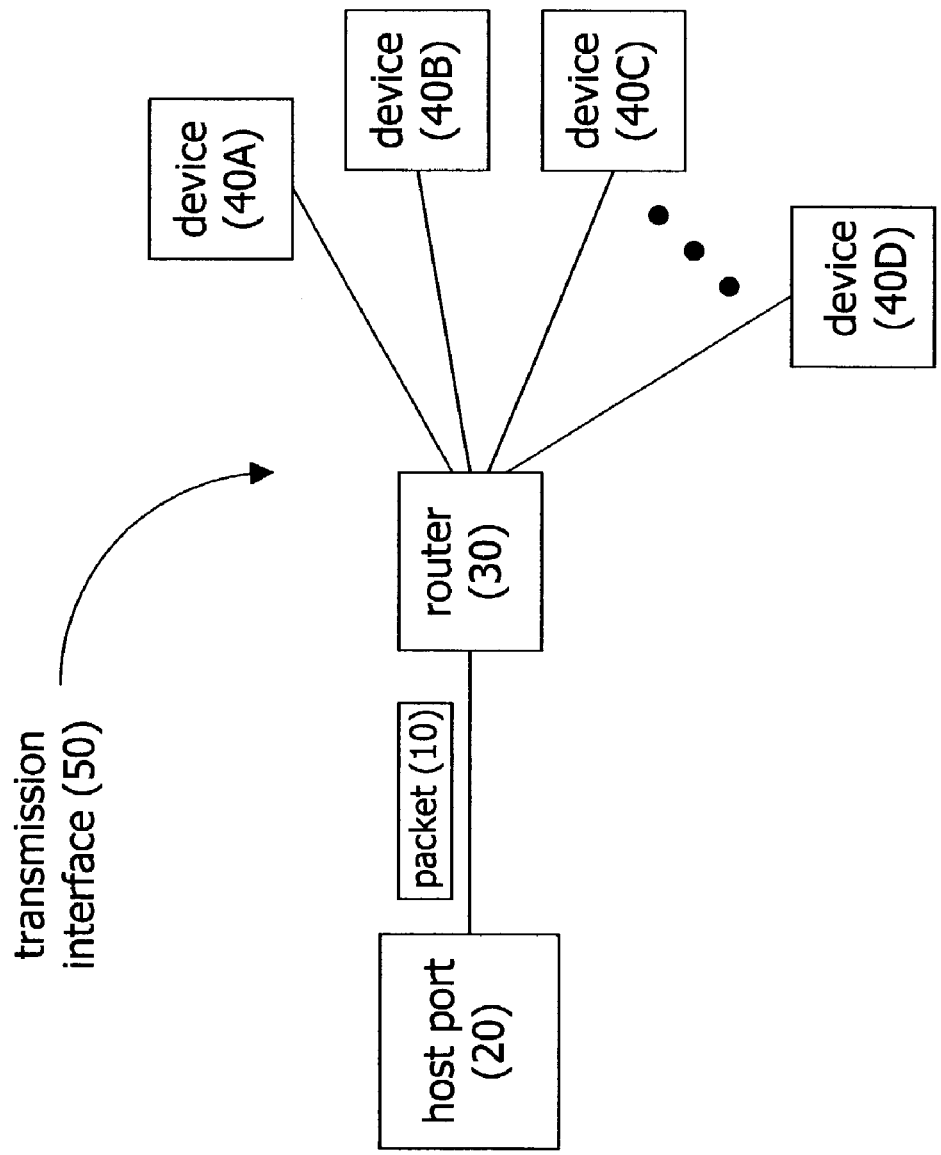
FIG. 2 is a block diagram of a transmission interface for transporting the packet of FIG. 1 according to one embodiment of the invention.

With reference to FIGS. 1 and 2, according to one embodiment, a packet 10 is depicted for transmission across an interface 50. The packet 10 includes a routing header 12, a header CRC, or $CRC_H$ 14, data 16, and a final CRC, or $CRC_F$ 18. The data 16 is the relevant information sought by an endpoint device, such as one of the receiving devices 40 of FIG. 2. (In FIG. 1, as well as FIGS. 3A, 3B, 4, 5A, 5B, and 6, below, the portions to be transmitted across the transmission interface are thickly bordered.)

The interface 50 includes a host port 20 or sending device and one or more endpoints or receiving devices 40A, 40B, 40C and 40D (collectively, receiving devices 40). The interface 50 is a point-to-point interface, including devices that communicate with one another, such as the host port 20 and receiving devices 40. (Although described herein as receiving devices, the devices 40 also transmit response packets.) The interface 50 may be a network or other collection of communicating devices.

The interface 50 may include one or more routers 30 coupled between the host port 20 and the receiving devices 40. Routers are entities that allow multiple receiving devices to be coupled to a single host port. The interface 50 of FIG. 2 may, for example, be operable under Serial ATA or another point-to-point interface.

Each of the devices in the interface 50 includes a CRC engine. As used herein, a CRC engine is a mechanism for performing polynomial arithmetic, such as modulo-2 arithmetic, on incoming packets or portions thereof, such that the validity of the packet or packet portion can be determined after the packet is received. The modulo-2 arithmetic is used to generate the CRC or to validate the data, known as a CRC check. CRC engines may be constructed from digital logic devices, firmware or other software programs, or a combination of hardware and software solutions, as examples. Generally, the contents of the packet 10 are not further processed by entities within the interface 50 until a CRC check is completed.

The router 30 receives the packet 10 from the host port 20. The router 30 does not interpret the data 16, but only the routing header 12, to determine which of the devices 40 is the intended recipient of the packet 10. To accomplish this, the router 30 includes a small amount of packet buffering, allowing it to receive at least the routing header 12 and the $CRC_H$ 14. A CRC engine within the router 30 performs polynomial arithmetic to confirm the validity of the routing header 12.

Before forwarding the packet 10, however, the router 30 modifies the routing header 12. The router could be constructing a reverse path back to the host port 20, selecting a preferred path to an endpoint, or performing other header modifications. Where the interface 50 includes more than one router 30, the routing header 12 may be changed multiple times. Since the routing header 12 is being changed, the $CRC_H$ 14 is also recomputed at each router 30.

In traditional CRC design, any time a portion of the packet 10 changes, the final CRC covering the entire packet is recomputed. However, the data 16 is not being modified; rather, only the routing header 12 is modified. Since the data 16 remains unchanged, it would be preferable not to change the $CRC_F$ 18 once it has been generated, yet still have the $CRC_F$ apply to the entire packet.

Figure 3A:
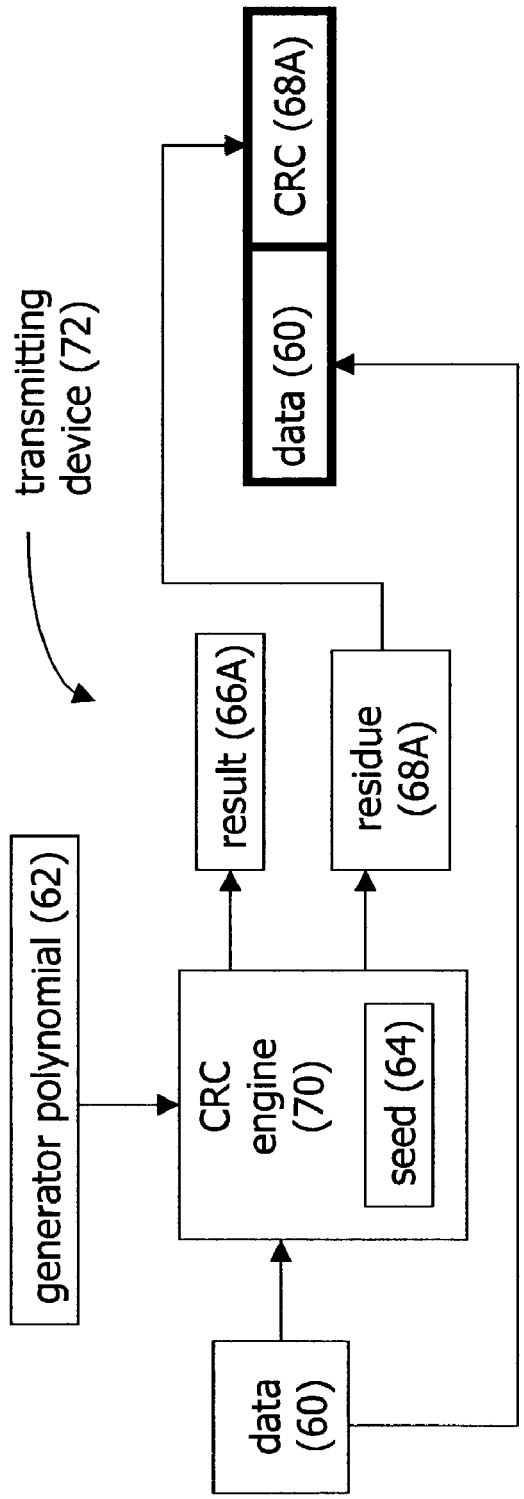
FIG. 3A is a block diagram of a CRC engine in a transmitting device according to the prior art.
Figure 3B:
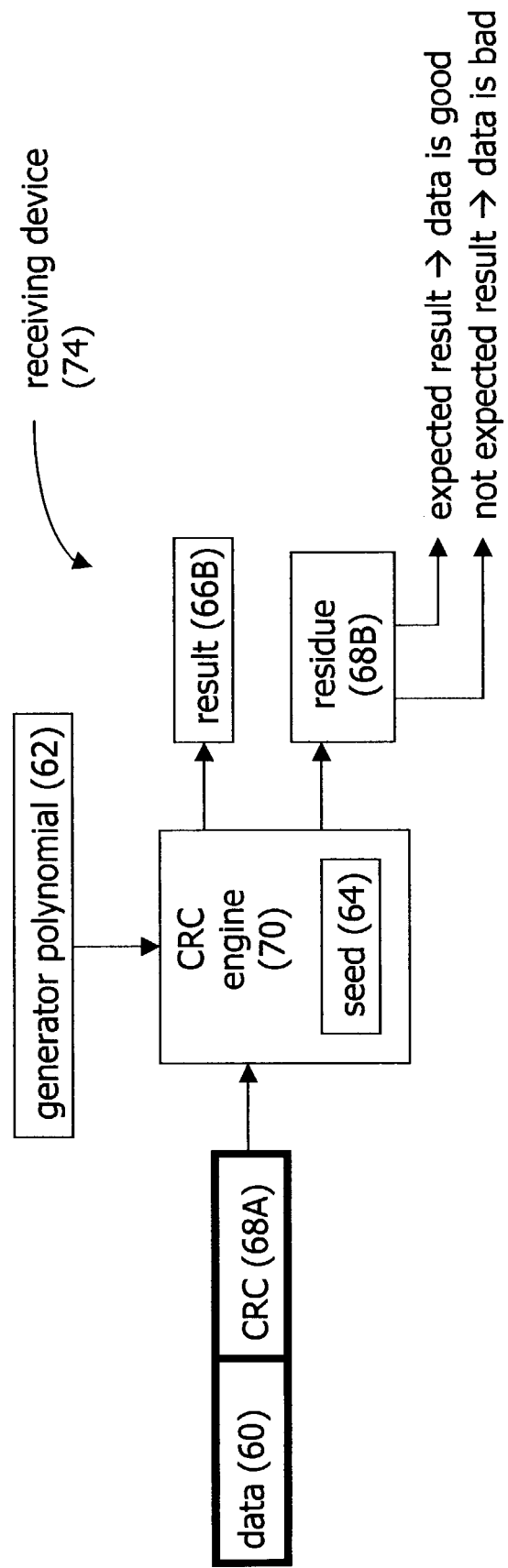
FIG. 3B is a block diagram of a CRC engine in a receiving device according to the prior art.

FIGS. 3A and 3B are block diagrams depicting the operation of a CRC engine 70 in a transmitting device 72 and in a receiving device 74, respectively, according to the prior art. The CRC engine 70 is identical in both the transmitting device 72 and the receiving device 74. The CRC engine 70 performs prime number modular arithmetic on a block of data 60, using a generator polynomial 62. The CRC engine 70 includes a seed 64, which is the initial state to which the CRC engine is set. The seed 64 is generally selected to be some non-zero value. Typically, both the transmitting device 72 and the receiving device 74 use the same seed 64.

The polynomial arithmetic performed by the CRC engine 70 produces a result 66A and a residue, also known as a remainder, 68A. Traditionally, the residue 68A obtained in the CRC operation is the CRC of the data 60. Thus, as shown in FIG. 3A, the residue 68A (i.e., the CRC) is appended to the data 60 and sent to the receiving device 74.

At the receiving device 74, both the data 60 and the CRC 68A are fed into the CRC engine 70. The CRC engine in the receiving device 74 is initialized with the same seed 64 and generator polynomial 62 as in the transmitting device 72, to produce a result 66B and a residue 68B. Where the residue 68B is different from an expected result, a transmission error occurred. A residue of the expected result indicates success. Some CRC engines are designed such that zero is the expected result, but any value may be the expected result.

In the packet 10 of FIG. 1, two CRCs are calculated at the transmitter, the header CRC, $CRC_H$ 14 and the final CRC, $CRC_F$ 18. If the traditional CRC design shown in FIGS. 3A and 3B is used for both the $CRC_H$ and the $CRC_F$, the CRC residue will be the expected result after the $CRC_H$ field 14 if the transmission was successful. Some CRC calculations are performed using a predetermined seed value as an initial state of the CRC engine. Serial ATA is one such protocol. Under Serial ATA, the CRC of the data is calculated using a seed of 0×52325032. To use the traditional CRC calculation of FIGS. 3A and 3B the CRC engine 70 would either be reset after calculating the $CRC_H$ 14 (so that the desired seed could be used in the subsequent $CRC_F$ calculation), which would make the $CRC_F$ 18 not cover the entire packet 10, or the CRC engine 70 would recalculate the $CRC_F$ 18, using the desired seed, following each change of the header 12. The CRC engine 70 would thus be reset between calculating the $CRC_H$ 14 and the $CRC_F$ 18.

Where Serial ATA is used, preferably, the header CRC is calculated in such a way that the CRC residue after calculating the header CRC is 0×52325032 (i.e., the initial seed value) instead of zero. Then, the CRC residue would be correct at the start of the data field on a valid packet, and the final CRC would simultaneously cover the entire packet and just the data portion of the packet.

FIGS. 4, 5A, 5B, and 6 depict a method for generating CRCs for packets comprising both a dynamic portion, such as the header, and a static portion, such as the data, wherein the packet is sent across the transmission interface 50 of FIG. 2. For each entity in the transmission interface 50, an identical CRC engine 22 is used. (In the figures, the CRC engine 22 is shown for clarity as 22A for the host port 20, 22B for the router 30, and 22C for the receiving device 40.)

The CRC engines 22 are designed such that the ending CRC for an entire packet with a prepended route header is the same CRC as with the route header (and associated header CRC) not present. Advantageously, a route header can be removed without recalculating the ending CRC value for the packet, while, at the same time, allowing a host port or other device within the transmission interface to treat a packet with a prepended route header as a single complete packet for which the ending CRC is calculated over the complete packet including the route header portion.

Figure 4:
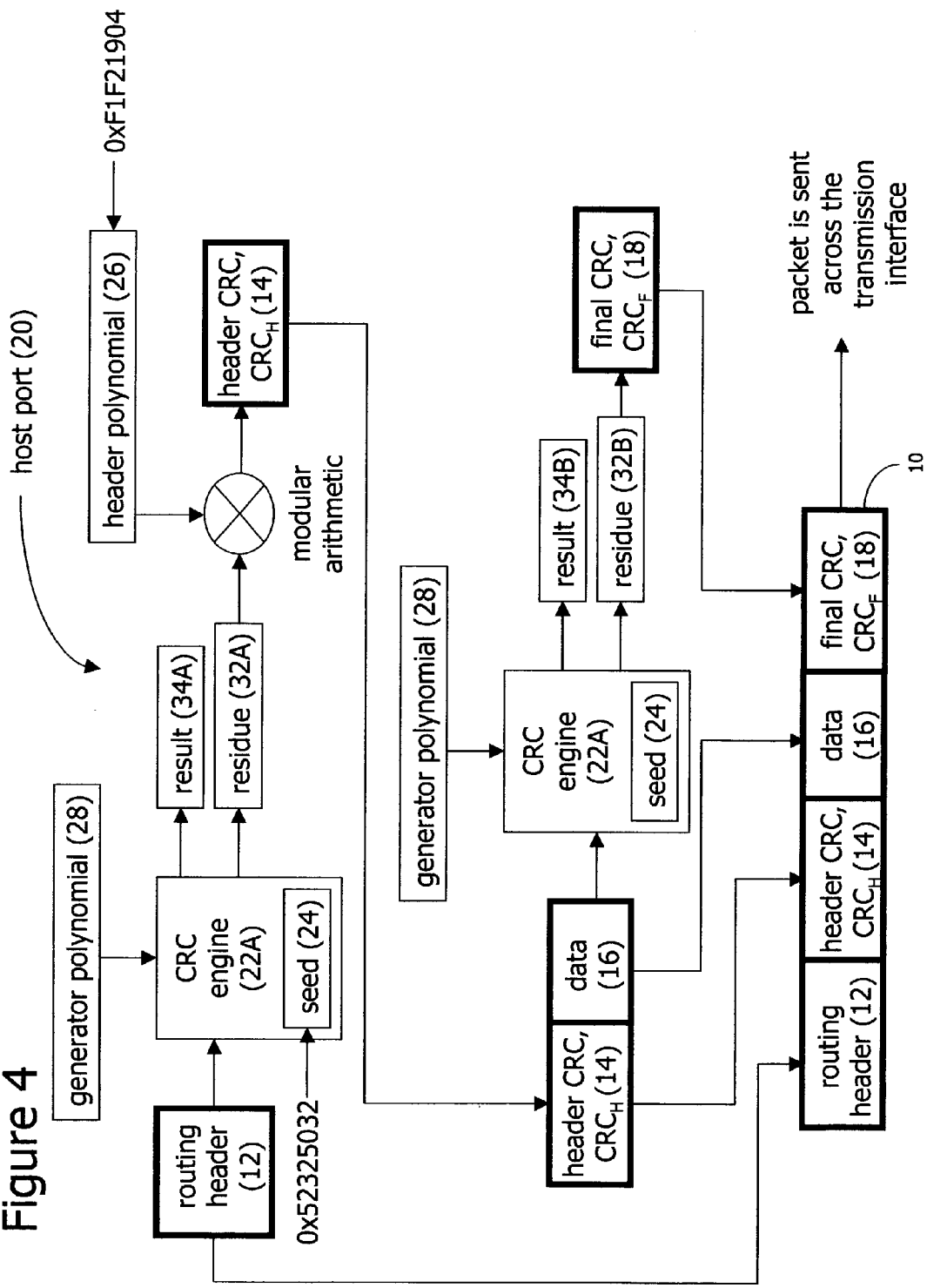
FIG. 4 is a block diagram of CRC calculations performed by the host port of FIG. 2 according to one embodiment of the invention.

The host port 20 generates a CRC for both the routing header 12 and the entire packet 10 (or just the data portion 16), generating both the $CRC_H$ 14 and the $CRC_F$ 18 prior to transmission across the interface 50 (FIG. 4). The router 30 verifies the integrity of the routing header 12 (FIG. 5A) and, since the header 12 is modified, generates a new routing header CRC prior to transmission across the interface 50 (FIG. 5B). The receiving device 40 verifies the entire packet 10 upon receipt or simply the data portion of the packet, such as when the header information is removed (FIG. 6). Whether the CRC engine 22 operates within the host port 20, the router 30, or the receiving device 40, the same initial state (seed) and generator polynomial are used.

Operation of a CRC engine within the host port 20 is depicted in the block diagram of FIG. 4. Both the $CRC_H$ 14 and the $CRC_F$ 18 are calculated using a single CRC engine 22A, and the CRC engine is not reset, or "re-seeded" between calculations. In the host port (FIG. 4), router (FIGS. 5A and 5B), and receiving devices (FIG. 6), the same seed 24 and generator polynomial 28 are used for all CRC calculations.

First, the CRC engine 22A processes the routing header 12 of the packet 10, using the initial seed 24 and the generator polynomial 28. In one embodiment, the packet 10 is to be transmitted across the transmission interface 50 using the Serial ATA protocol. Accordingly, the generator polynomial 28 is set to the CRC-32B polynomial and the seed 24 is set to 0×52325032. As expected, the CRC engine 22A produces a result 34A and a residue 32A.

Rather than using the residue 32A as the CRC for the header 12, the host port 20 performs an additional modular arithmetic operation on the residue, using a header polynomial 26. In some embodiments, for example an exclusive OR (XOR) operation is performed. The result of the arithmetic operation produces the header CRC, $CRC_H$ 14.

When the CRC engine 22A receives the routing header 12 and the $CRC_H$ 14 and performs modular arithmetic on them, a residue of the initial seed value 24 is obtained, in the absence of an error. Thus, the proper initial state for calculating the $CRC_F$ 18 is obtained by performing the modular arithmetic at the end of the $CRC_H$ calculation, not following the $CRC_F$ calculation.

The header polynomial 26, when divided by the generator polynomial 28, yields a residue of the initial seed value 24. In the Serial ATA embodiment, the generator polynomial 28 is unchanged, and the header polynomial 26 is set to 0×F1F21904. When divided by the generator polynomial, a residue of 0×52325032 is obtained, which is the initial state for performing the final CRC calculation. Where the packet 10 is transmitted under other protocols, the header polynomial 26 can similarly be selected to generate the desired intermediate residue 32A.

The mathematical operations performed by the CRC engines 22A, 22B, and 22C (collectively, CRC engines 22) cause the intended result because there is a one-to-one mapping between the CRC inserted in the packet and the residue obtained at the receiver after the CRC is checked. In other words, whenever the generator polynomial divides a 32-bit value (polynomial), a unique value is obtained. The subsequent modular arithmetic operation performed simply maps the intended result, whether zero or non-zero, to another value, such as the Serial ATA seed of 0×52325032.

Still at the host port 20, after the $CRC_H$ 14 is calculated, the $CRC_H$ 14 and the data 16 from the packet 10 are fed into the CRC engine 22A without resetting the engine. Using the same generator polynomial 24, the CRC engine performs modular arithmetic to produce a new result 34B and a new residue 32B. The CRC engine 22A is not reset or "re-seeded" with a new seed, but, instead, continues uninterrupted from the prior calculation of the $CRC_H$ 14. The residue 32B is the final CRC, or $CRC_F$ 18. The packet 10 comprising the routing header 12, the header CRC 14, the data 16, and the final CRC 18 are transmitted across the transmission interface 50 by the host port 20.

Figure 5A:
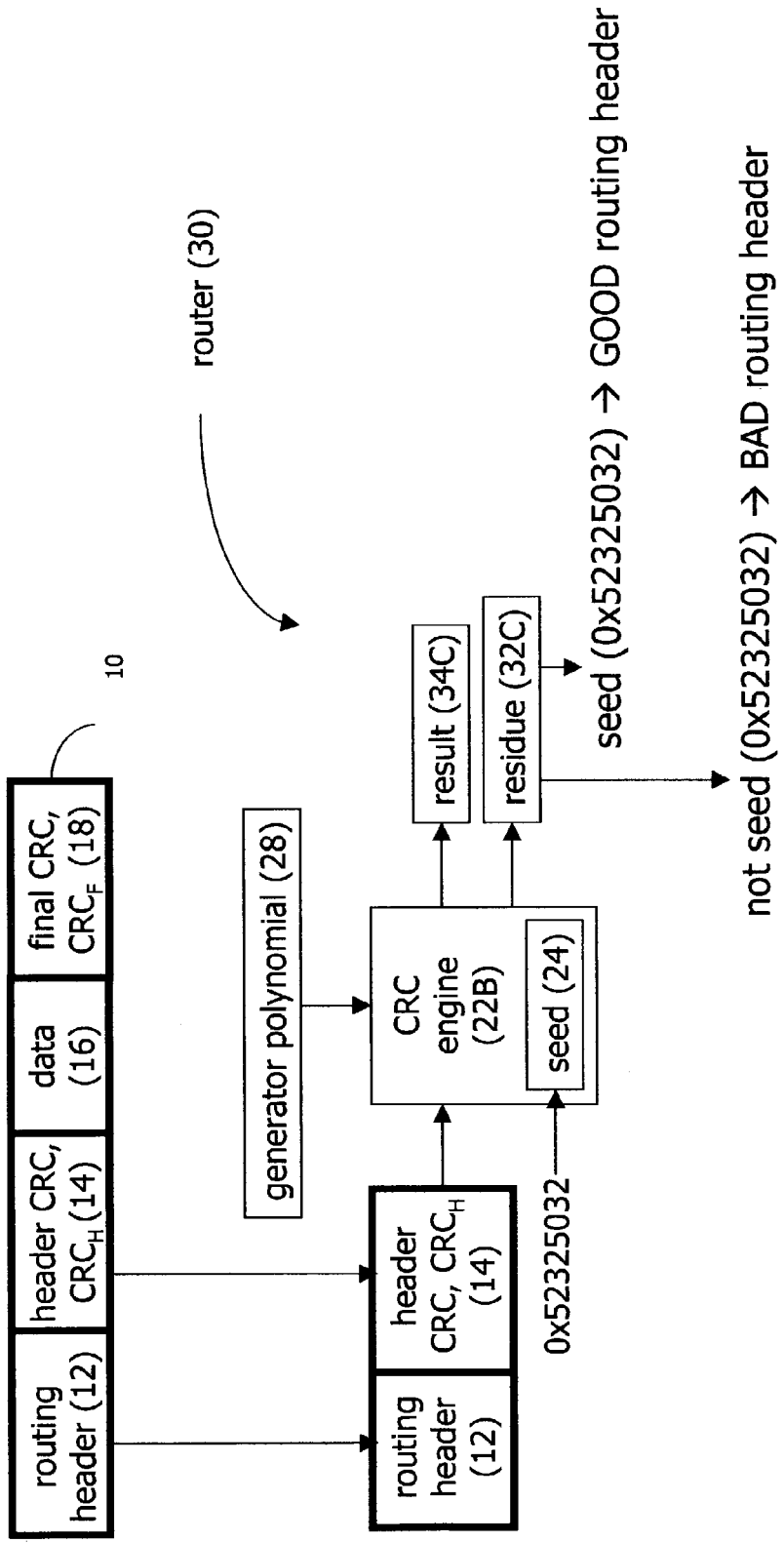
FIGS. 5A and 5B are block diagrams of CRC calculations performed by the router of FIG. 2 according to one embodiment of the invention.
Figure 5B:
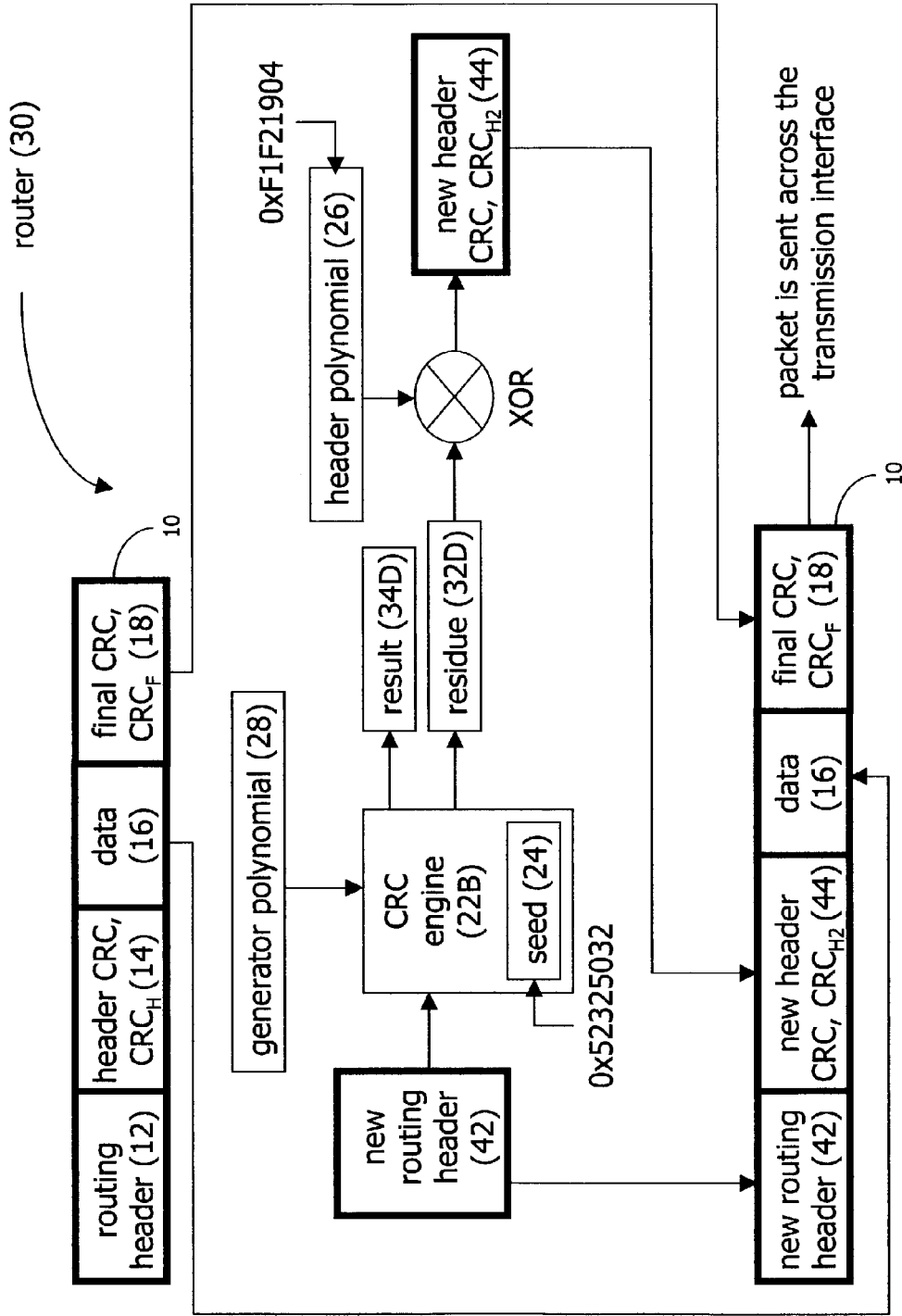
Figure 6:
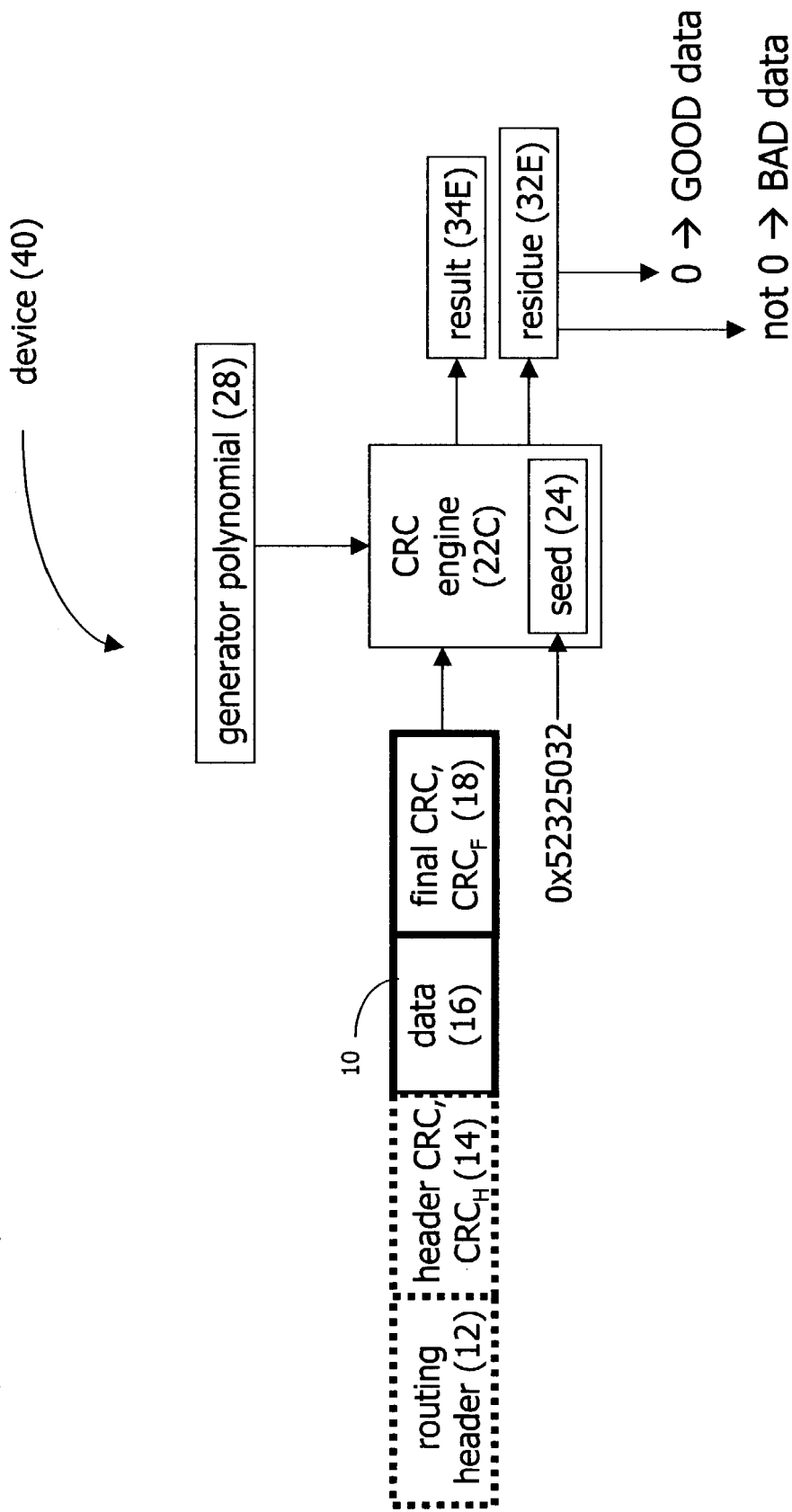
FIG. 6 is a block diagram of CRC calculations performed by the receiving device of FIG. 2 according to one embodiment of the invention.

As depicted in FIGS. 5A and 5B, respectively, the router 30 both verifies the header 12 and generates a new routing header 42. As in the host port 20, the same CRC engine (shown as CRC engine 22B) is used, as well as the same generator polynomial 28 and initial seed value 24.

In FIG. 5A, to verify the routing header 12, the CRC engine 22B receives a portion of the packet 10, including the routing header 12 and the $CRC_H$ 14. Initialized with the seed 24, the CRC engine 22B uses the generator polynomial 28 to verify the routing header 12 and the $CRC_H$ 14. In the Serial ATA embodiment, the seed 24 is 0x52325032.

As expected, a result 34C and a residue 32C are produced. Because of the modular arithmetic performed in the host port 20, the residue 32C is expected to be the initial seed value 24, rather than zero, the typical result when verifying CRCs. Where the residue 32 is not identical to the initial seed value, the routing header 12 is invalid. In the Serial ATA embodiment, a residue 32C of 0x52325032 indicates successful transmission of the routing header 12.

Once the routing header 12 is deemed valid, the router 30 produces a new routing header 42. Recall that the packet 10 can be transmitted to multiple routers before being received by the intended receiving device 40. At each router 30, the route header 12 is modified, such as to construct a reverse path back to the host port 20, select a preferred path to an endpoint, or perform other header modifications. Since the route header 12 is modified at each router 30, the $CRC_H$ 14 is likewise recomputed at each router 30.

Accordingly, in FIG. 5B, the new routing header 42 is fed into the CRC engine 22. Since the new routing header 42 is different from the old routing header 14, the CRC engine 22 is reset, or "re-seeded" with the seed 24, as if generating the header CRC for the first time. In the Serial ATA embodiment, the generator polynomial is the CRC-32B polynomial and the seed is 0x52325032.

The operations of FIG. 5B are similar to the initial operation of the host port 20 in calculating the $CRC_H$ 14. The CRC engine 22B performs modular arithmetic to produce a result 34D and a residue 32D. A second modular arithmetic operation outside the CRC engine 22b is performed between the residue 32D and the header polynomial 26. In the Serial ATA embodiment, the header polynomial 26 is 0xF1F21904. The result of the second modular operation produces the new header CRC, or $CRC_{H2}$ 44.

The new routing header 42 and the $CRC_{H2}$ 44 are transmitted, along with the untouched portions (the data 16 and the $CRC_F$ 18) of the packet 10, to either a receiving device 40 or another router 30 along the transmission interface 50. Notice that the router 30 left the data 16 and the $CRC_F$ 18 untouched during both the verification of the header CRC 14 (FIG. 5A) and the updating of the header CRC (FIG. 5B). Put another way, the router 30 performed no verification of the data 16 and the $CRC_F$ 18.

In FIG. 6, operation of the CRC engine within the receiving device 40 is depicted. Like the host port 20 and the router 30, the CRC engine of the receiving device 40, shown as CRC engine 22C, uses the same generator polynomial 28 and initialization seed 24. In the Serial ATA embodiment, the generator polynomial is the CRC-32B polynomial and the seed 24 is 0x52325032.

The input to the CRC engine 22C can be the entire packet 10, comprising the routing header 12 (or new routing header 42), the $CRC_H$ 14 (or $CRC_{H2}$ 44), the data 16, and the $CRC_F$ 18, as shown. Alternatively, the input can be just the data 16 and the $CRC_F$ 18. This is because the routing header 12 and $CRC_H$ 14 (or the new routing header 42 and $CRC_{H2}$ 44) were subsequently generated using the second modular arithmetic operation, to ensure that the residue of the header verification operation is the seed 24. The operation performed by the CRC engine 22C produces the same result, in either case. The routing header 12 and the $CRC_H$ 14 are depicted with dashed lines in FIG. 6, to indicate that they are optionally received into the CRC engine 22C during data verification. Thus, the final CRC, $CRC_F$ 18 can be said to cover either the entire packet 10 or just the data 16.

The CRC engine 22C performs modular arithmetic on the input data stream and produces a result 34E and a residue 32E. Where the residue 32E is non-zero, the data 16 is deemed bad. Where the residue 32E is zero, the data 16 is deemed good, having been transmitted successfully over the transmission interface 50. In other embodiments, an expected result besides zero may be obtained during correct operation.

The receiving device 40 need not perform verification of the routing header 12 and the $CRC_H$ 14 (or the $CRC_{H2}$ 44, where appropriate). Instead, the receiving device 40 performs verification of the data 16 (whether by operating on the data portion 16 and the $CRC_F$ 18 or on the entire packet 10). Likewise, the router 30 performs a CRC only on the routing header 12. The transmitting device, or host port, generates both CRCs. This division of labor simplifies operation for both the receiving device 40 and the router 30.

Further, by not requiring a recalculation of the $CRC_F$ 18 by the router 30 after the routing header is changed, an error will not inadvertently be corrected. Also, routing headers can be modified or removed without having to recalculate the final CRC covering the entire packet. By recalculating the CRC only when a portion of the packet has changed, and by not having the final CRC cover the changing portion of the packet, unnecessary recalculation of CRCs is avoided.

The above scheme is preferable over prior art implementations in which the CRC engine is reset between calculation of the $CRC_H$ and the $CRC_F$. A single additional modular arithmetic operation, such as an XOR calculation, is readily implemented in both hardware and software, and is less costly than re-initializing, or "re-seeding" the CRC engine, according to one embodiment.

Additional benefits of using the above-described CRC implementation include its simplicity of design. The CRC engine 22 operates identically in the host port 20, the router 30, and the device 40. In particular, no change to the receiving devices 40 is needed. In part because the $CRC_F$ 18 covers both the data 16 alone and the data 16, plus the header 12 and $CRC_H$ 14, legacy receiving devices 40 will correctly calculate the CRC of the data upon receipt. New receiving devices can be designed to calculate the $CRC_F$ using only the data 16 of the packet 10, if desired.

The avoidance of recalculating $CRC_F$ 18 is further beneficial. Headers can simply be designed to produce the desired residue, by performing the additional modular operation following the modular operation of the CRC engine. A single $CRC_F$ verification operation, at the receiving device, is performed following the single $CRC_F$ creation operation at the host port. Since the data 16 does not change during the intermediate steps within the one or more routers, unnecessary recalculations of $CRC_F$ are appropriately avoided.

Further, the CRC operations performed in the CRC engine 22 may extend to any modulo-based operations in which the modulus is a prime number, not just modulo-2 arithmetic. Likewise, the additional modular operation performed outside the CRC engine 22 (in the host port and the header) may extend to any modulo-based operations in which the modulus is a prime number, such as an XOR operation, which is a modulo-2 calculation.

Another benefit of the above-described CRC operations is that the $CRC_H$ could be readily calculated in software, where the header is short and the prime-number modulus operation is manageable. Then, the header, the $CRC_H$, and the data could be passed through the CRC engine. This would allow host devices without any special hardware to send packets with a special header attached and, nevertheless, use a legacy hardware CRC engine over the large portion of data. Such would be preferable in the Serial ATA embodiment, in which the header is on the order of 32 bytes long while the data portion is closer to 8K bytes in length.

The operations described in FIGS. 4, 5A, 5B, and 6 work due to the way binary polynomial arithmetic works. The header polynomial 26, when divided by the generator polynomial, yields a residue of the initial seed value 24. By inserting the modulus operation, such as XOR, into the header CRC calculation (or re-calculation), the final portion of the CRC division yields the header polynomial 26 divided by the generator polynomial 28. The XOR operation is an addition in binary polynomial arithmetic of the current residue 32A from the header polynomial 26.

So, where the residue before processing the $CRC_H$ field, residue $32A=R(x)$; the $CRC_H$ 14$=C(x)$, the generator polynomial 28$=G(x)$, the seed 24$=S(x)$, and the header polynomial 26$=H(x)$, and using XOR as the modular operation, the final CRC value is the residue of:

$$(R(x) \text{ XOR } C(x))/G(x)$$

In order to get the seed, $S(x)$, as the residue, $R(x)$ XOR $C(x)$ must be equal to the header polynomial, $H(x)$. To achieve this, $C(x)$ must be equal to $(R(x) \text{ XOR } H(x))$. This yields:

$$(R(x) \text{ XOR } C(x))/G(x) = (R(x) \text{ XOR } (R(x) \text{ XOR } H(x)))/G(x)$$

$$(R(x) \text{ XOR } (R(x) \text{ XOR } H(x)))/G(x) = H(x)/G(x)$$

Therefore, the value of the CRC after processing the header CRC, $H(x)$, is equal to the seed, $S(x)$.

While the invention has been described with respect to a limited number of embodiments, those skilled in the art will appreciate numerous modifications and variations therefrom. It is intended that the appended claims cover all such modifications and variations as fall within the true spirit and scope of the invention.

We claim:

1. A transmission interface, comprising:
   a packet to be transmitted across the transmission interface, the packet comprising a header, a first cyclic redundancy check associated with the header, a data portion, and a second cyclic redundancy check; and
   a device for transmitting the packet across the transmission interface, the device including an engine for computing cyclic redundancy checks, wherein the device:
   generates the first cyclic redundancy check by:
      initializing the engine with a seed;
      performing a first modular arithmetic operation on the header of the packet, using a generator polynomial, to produce a residue; and
      performing a second modular arithmetic operation on the residue using a header polynomial.

2. The transmission interface of claim 1, wherein the device further:
   performs the first modular arithmetic operation on the data portion, using the generator polynomial, to compute the second cyclic redundancy check.

3. The transmission interface of claim 2, wherein the engine is not re-initialized with a new seed between generating the first cyclic redundancy check and the second cyclic redundancy check.

4. The transmission interface of claim 3, further comprising
   a third device for receiving the packet across the transmission interface, wherein the third device verifies an error-free transmission of the data by:
      initializing a third engine with the seed;
      obtaining a second portion of the packet into the third engine, the second portion comprising the header, the first cyclic redundancy check, the data portion, and the second cyclic redundancy check;
      performing the first modular arithmetic operation on the second portion using the generator polynomial, to produce a third residue;
   wherein the third residue is an expected result.

5. The transmission interface of claim 4, wherein the engine, the second engine, and the third engine are identical.

6. The transmission interface of claim 4, wherein the engine, the second engine, and the third engine comprise hardware circuitry.

7. The transmission interface of claim 4, wherein the engine, the second engine, and the third engine comprise software programs.

8. The transmission interface of claim 4, wherein the engine, the second engine, and the third engine comprise a combination of hardware circuitry and software programs.

9. The transmission interface of claim 4, wherein the device is a host port, the second device is a router, and the third device is a receiving device.

10. The transmission interface of claim 4, wherein the modulus in the first and second modular arithmetic operations are prime numbers.

11. The transmission interface of claim 10, wherein the first modular arithmetic operation is a modulo-2 operation and the second modular arithmetic operation is an exclusive OR operation.

12. The method of claim 11, further comprising:
   identifying a change to the dynamic portion to a new dynamic portion;
   generating a fourth cyclic redundancy check value for the new dynamic portion;
   transmitting the packet comprising the new dynamic portion across the interface to a receiving device;
   receiving a third packet portion comprising the new dynamic portion and the fourth cyclic redundancy check; and
   generating a fifth cyclic redundancy check of the third packet portion to produce a third residue;
wherein the third residue equals the seed following error-free transmission of the packet across the interface.

13. The transmission interface of claim 3, further comprising:
a third device for receiving the packet across the transmission interface, wherein the third device verifies an error-free transmission of the data by:
initializing a third engine with the seed;
obtaining a second portion of the packet into the third engine, the second portion comprising the data portion and the second cyclic redundancy check;
performing the first modular arithmetic operation on the second portion using the generator polynomial, to produce a third residue;
wherein the third residue is an expected result.

14. The transmission interface of claim 2, further comprising:
a second device for receiving the packet across the transmission interface, wherein the second device verifies an error-free transmission of the header by:
Initializing a second engine with the seed;
obtaining a portion of the packet into the second engine, the portion comprising the header and the first cyclic redundancy check;
performing the first modular arithmetic operation on the portion using the generator polynomial, to produce a second residue;
wherein the second residue equals the seed.

15. The transmission interface of claim 1, wherein the seed is 0×52325032 and the header polynomial is 0×F1F21904.

16. A method, comprising:
generating a first cyclic redundancy check of a dynamic portion of a packet using a seed;
generating a second cyclic redundancy check of a static portion of the packet;
transmitting the packet across an interface to a receiving device;
receiving a packet portion comprising the dynamic portion and the first cyclic redundancy check; and
generating a third cyclic redundancy check of the packet portion to produce a first residue;
wherein the first residue equals the seed following error-free transmission of the packet across the interface.

17. The method of claim 16, generating the first cyclic redundancy check value further comprising:
initializing an engine with the seed;
performing a first modular arithmetic operation on the dynamic portion of the packet using a generator polynomial, to produce a second residue, wherein a first modulus of the first modular arithmetic operation is a prime number; and
performing a second modular arithmetic operation on the second residue using a header polynomial, wherein a second modulus of the second modular arithmetic operation is a prime number.

18. The method of claim 16, generating the second cyclic redundancy check value further comprising:
performing the first modular arithmetic operation on a second packet portion using the generator polynomial, the second packet portion comprising the dynamic portion, the first cyclic redundancy check value, and the static portion of the packet.

19. A system comprising:
an engine initialized using a seed, wherein the engine performs modular arithmetic on incoming packets using a generator polynomial;
a host port comprising the engine, wherein the host port engine:
generates a first cyclic redundancy check for a first portion of the packet; and
generates a second cyclic redundancy check for a second portion of the packet; and
a router comprising the engine, wherein the router is remote from the host port and the host port transmits packets to the router, wherein the router engine:
performs modular arithmetic on the first cyclic redundancy check and the first portion to produce a residue equal to the seed where the packet is transmitted without error.

20. The system of claim 19, further comprising:
a receiving device comprising the engine, wherein the receiving device is remote from the host port, wherein the receiving device engine:
performs modular arithmetic on the second cyclic redundancy check and the second portion to produce a residue equal to an expected result where the packet is transmitted without error.

21. The system of claim 19, further comprising:
a receiving device comprising the engine, wherein the receiving device is remote from the host port, wherein the receiving device engine:
performs modular arithmetic on the first portion, the first cyclic redundancy check, the second cyclic redundancy check, and the second portion to produce a residue equal to an expected result where the packet is transmitted without error.

22. The system of claim 19, further comprising:
a receiving device comprising the engine, wherein the receiving device is remote from the host port, wherein the receiving device engine:
performs modular arithmetic on either a first collection comprising the first portion, the first cyclic redundancy check, the second cyclic redundancy check, and the second portion, or a second collection comprising the second cyclic redundancy check and the second portion, wherein the residue produced by the receiving device is identical whether performed on the first collection or the second collection.

* * * * *